Aug. 9, 1960 R. W. MacDONALD 2,948,642
SURFACE TREATMENT OF SILICON DEVICES
Filed May 8, 1959
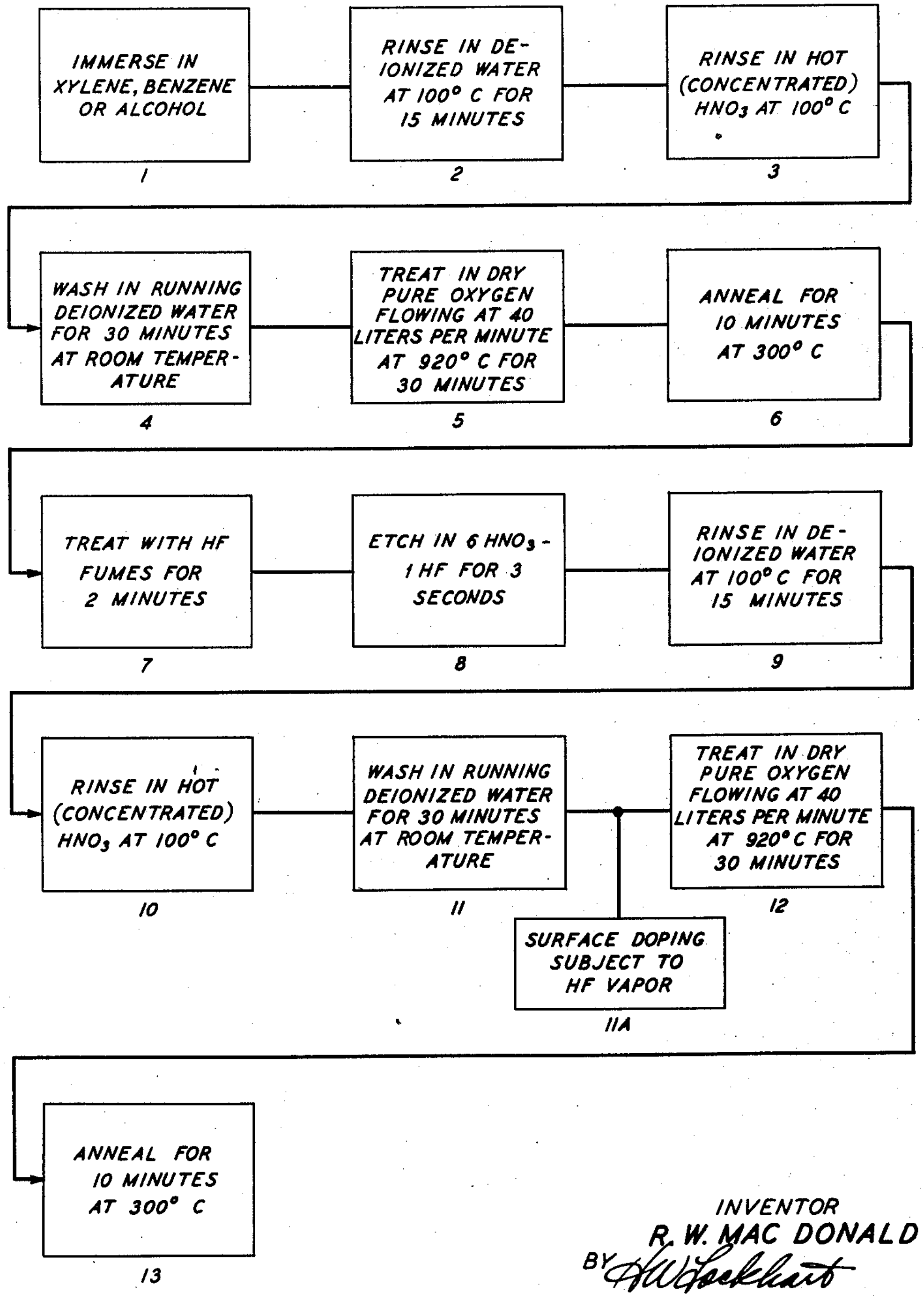
INVENTOR
R. W. MAC DONALD
BY H.W. Lockhart
ATTORNEY United States Patent Office 2,948,642 Patented Aug. 9, 1960

2,948,642

SURFACE TREATMENT OF SILICON DEVICES

Robert W. MacDonald, Murray Hill, N.J., assignor to Bell Telephone Laboratories, Incorporated, New York, N.Y., a corporation of New York Filed May 8, 1959, Ser. No. 811,896

6 Claims. (Cl. 148—1.5)

This invention relates to the surface treatment of silicon in the fabrication of silicon devices.

Surface phenomena and the effect of these phenomena on the electrical characteristics of semiconductor devices have been subject to extensive study as is evidence by United States Patent 2,816,850, granted December 17, 1957, to H. E. Haring, and United States Patent 2,748,-325, granted May 29, 1956, to D. A. Jenny.

Both of these patents disclose the use of protective coatings of oxide to passivate the semiconductor surface. Copending application Serial No. 732,026 of M. M. Atalla, E. J. Scheibner and E. Tannenbaum, filed April 30, 1958, and assigned to the assignee of the present application, and now Patent No. 2,899,344, issued August 11, 1959, discloses a particular method for passivating a semiconductor surface and/or inducing a surface of specific conductivity type.

This invention, likewise, is concerned with a method for passivating a semiconductor surface and/or inducing a surface of specific conductivity type.

It has been found that all silicon semiconductor bodies treated in accordance with the above-mentioned method of Atalla et al., do not retain unchanged their electrical characteristics after treatment and aging. This is attributed in part to the growth of imperfect oxide coats caused by residual contaminants which either diffuse to the oxide coat or become imbedded in the semiconductor surface. The phenomenon involved appears to be as follows: as the oxide grows, the interface between the silicon and silicon dioxide will advance into the silicon whereby silicon atoms will cross the interface and diffuse into the oxide to its free surface where they combine with oxygen to form silicon dioxide. When the Si—$SiO_2$ interface reaches a body impurity, the impurity either crosses the interface into the oxide, or remains in the silicon depending on its distribution coefficient. The distribution coefficient is a measure of the relative affinity an impurity has for the oxide and equals the concentration of impurities in the oxide divided by the concentration in the silicon at a given temperature. The impurities which cross the interface from the silicon to the oxide layer give rise to imperfect oxide growth, the impurities which remain in the silicon accumulate at the Si—$SiO_2$ interface, and give rise to impurities some of which are chemically changed by the oxidation process and all of which are imbedded in or near the surface of the semi-conductor wafer.

One object of this invention is improved semiconductor devices having stable and uniform electrical characteristics.

Another object is a method of producing surface oxide films which induce particular conductivity-type surface regions on semiconductor devices.

A further object is to provide semiconductor devices whose electrical properties remain stable for long periods of time.

An understanding of this invention will be facilitated by a consideration of the concept of surface states. The energy band structure at the surface of a semiconductor has evolved from the formulations and investigations of various workers. One exposition in this connection entitled "Surface States and Rectification at a Metal to Semiconductor Contact," by J. Bardeen, appears in the Physical Review, volume 7, page 717, published in 1947. Another is found in a book entitled "Semiconductor Surface Physics," edited by R. H. Kingston, pages 154 through 162, published July 23, 1956, by University of Pennsylvania Press.

Indications are that an atomically clean semiconductor surface is not desirable from the standpoint of device compatibility and electrical stability. For the purpose of analysis, a semiconductor surface film, such as an oxide, can be characterized as including several different forms of surface states referred to as "fast" or "slow," depending on the time for the charge characteristic of such state to transfer through the particular layers of the film. "Fast" states are located at the interface of the semiconductor body and the oxide film, and the "slow" states are located at the surface of the oxide film and possibly in the oxide film itself. In general, it has been found that "fast" states are responsible for the surface recombination and "slow" states are responsible for surface instabilities. Therefore, the procedures of this invention are directed at the control of the semiconductor surface impurities and the growth of the protective oxide.

The copending application of Atalla et al., Serial No. 732,026, and now Patent No. 2,899,344, issued August 11, 1959, cited above discloses a method of controlling both the surface impurities and the characteristics of the oxide film.

In accordance with one embodiment of the Atalla et al. invention, a body of single crystal silicon is subjected to the following succession of processing steps. The device is first etched in a mixture of hydrofluoric and nitric acid and this is followed by a chemical cleaning in a hot solvent, such as xylene or benzene. The device is then rinsed in boiling de-ionized water, and next it is treated in hot nitric acid. Subsequent to this acid treatment, the body is rinsed in hot de-ionized water for a short period followed by a similar period of rinsing in de-ionized water at room temperature. Upon completion of these steps, the silicon body exhibits surfaces which are lightly oxidized and hydrophilic in character.

At this juncture in the fabrication, a choice is exercised as to the final character of the device surface. With a high purity crystal, a permanent P-type conductivity surface can be induced by next subjecting the silicon device to high purity oxygen at a temperature typically of about 920 degrees centigrade for a short period of time. Under these conditions, the surface prepared in accordance with the preceding method will have a surface film of silicon oxide which has a thickness between approximately 200 and 10,000 Angstroms and which will induce a P-type conductivity surface region.

Alternatively, an oxide-induced N-type conductivity surface can be provided by subjecting the silicon surface to hydrofluoric acid vapor for a short time immediately prior to the thermal oxidation step. N-type conductivity may also be induced by providing that certain significant impurities, for example, gold and iron be present in the silicon body prior to the surface treatment steps. These impurities will be drawn into the surface oxide film during the thermal oxidation step resulting in an N-type conductivity surface layer.

However, as previously mentioned not all devices fabricated from material processed in accordance with the foregoing method retain unchanged their electrical characteristics in operation or after aging treatment.

In accordance with one embodiment of the present invention, a body of single crystal silicon is subjected to the following succession of steps: (1) Wash the crystal in xylene, benzene or alcohol; (2) wash in de-ionized water; (3) wash in hot nitric acid; (4) wash in running de-ionized water; (5) treat at approximately 920 degrees centigrade with flowing dry oxygen; (6) anneal at approximately 300 degrees centrigrade; (7) remove the oxide; and (8) etch the semiconductor surface and repeat the series of steps two through six. Step 6 may be left out in the first series, but for most devices, it is an important step in the second series.

The invention and its further objects and advantages will be better understood from the following detailed description taken in connection with the accompanying drawings forming part of the specification and wherein the drawing is a block diagram illustrating the various steps of the method of this invention.

A consideration of the process in accordance with this invention will be facilitated by referring to the flow diagram of the drawing.

As indicated in step 1, the semiconductive wafer is immersed in one of a class of hydrocarbon solvents including xylene, benzene or alcohol to remove any coating material remaining from previous fabrication operations. Of course, if the previous processing has not left any residual coating, this step is superfluous and accordingly, may be omitted. Next as specified in step 2, the semiconductor device is rinsed in de-ionized water at about 100 degrees centigrade for about 15 minutes. Step 3 indicates a rinse in a 70 percent solution of concentrated nitric acid in water at 100 degrees centigrade for 15 minutes whereafter, in step 4, the semiconductor device is washed in running de-ionized water for 30 minutes at room temperature. This chemical cleaning removes the bulk of the organic contaminants from the surface. The surface may now be characterized as lightly oxidized and almost perfectly hydrophilic. During this process, it is important that the semiconductor device be protected from any possible outside contamination. For this purpose, it is convenient to handle the semiconductor element in a small basket, or similar container, made of an inert material such as platinum. The wafer is then treated in dry oxygen flowing at a rate of 40 liters per minute at 920 degrees centigrade for 30 minutes to produce approximately a 300 Angstrom layer of oxide over its surface as is indicated in step 5. The wafer is then annealed for 10 minutes at 300 degrees centigrade as indicated in step 6.

Next, the oxide film formed by the foregoing steps is removed by exposing the oxide to hydrofluoric acid fumes for approximately two minutes. The semiconductor surface is then etched in a solution comprising six parts concentrated nitric acid and one part concentrated hydrofluoric acid by volume for approximately three seconds as is indicated in steps 7 and 8, respectively. A new oxide film then is grown over the wafer as indicated in steps 9 through 13 by repeating steps 2 through 6. This new oxide growth is substantially free of impurities since the contaminants which caused the initial oxide layer to grow imperfectly now have been removed. The resulting devices had extremely stable and substantially uniform electrical characteristics.

The oxygen employed in steps 5 and 12 should advantageously be of high purity. This may be provided by any one of many well-known techniques such as liquifying the oxygen by liquid nitrogen and removing the oxygen fumes above the liquid.

The thickness of the oxide film is proportional to the square root of the length of time of oxidation. Oxide films of the order of 200 to 500 Angstroms may be produced by treatments of from approximately 10 minutes to 60 minutes at a temperature of about 900 degrees centigrade. The temperature at which the oxidation is carried out is not critical, the temperature advantageously should be high enough to result in oxide films of the desired thickness in a reasonable length of time, but not in excess of a value that would result in deleterious effects to the wafer.

The conductivity type of the surface which is underlying the oxide film is a function of the impurity content of the silicon crystal prior to and during the thermal oxidation step 12. If the semiconductive wafer was originally of high purity material, for example, having an impurity concentration no more than about $10^{-13}$ atoms/cc.[3] steps 9 through 12 will produce surfaces of P-type conductivity. By subjecting such a semiconductive wafer to the hydrofluoric acid vapor of step 11*a*, prior to the thermal oxidation, step 12 will result in an N-type conductivity surface. Several other techniques are known by which the oxide covered silicon surface may be rendered of N-type conductivity. For example, the prior diffusion of gold into the silicon by means well known in the art insures an N-type conductivity surface upon thermal oxidation.

It will be observed from the foregoing described steps that the method in accordance with this invention is useful both to passivate a surface of the same conductivity type as that of the underlying material, and to provide a thin surface layer of a conductivity type opposite to that of the underlying material.

Although the invention has been disclosed in terms of the foregoing specific embodiment, it will be recognized that various modifications thereof may be devised by those skilled in the art which will be within the scope and spirit of this invention.

For example, the purpose of the annealing step of the process is to preserve lifetime of minority carriers. This is not necessary for some semiconductive devices such as logic diodes and is necessary to a greater extent than described herein in devices such as crosspoint diodes.

What is claimed is:

1. The method of treating surfaces of silicon semiconductor devices to provide a surface layer of a specific conductivity type comprising thermally oxidizing the surface of a semiconductive body, removing the resultant oxide layer, etching the exposed semiconductor body surface, diffusing an element from the group consisting of gold and iron into the semiconductor body, regrowing the oxide layer and attaching electrodes.

2. The method of treating the surface of silicon semiconductor devices to provide electrically stable semiconductor surfaces comprising washing a body of silicon semiconductor material in one of a class of hydrocarbon solvents including xylene and benzene or alcohol, washing in de-ionized water, washing in hot nitric acid, washing in running de-ionized water, treating with flowing dry oxygen, removing the oxide, etching briefly in a mixture of nitric and hydrofluoric acid, washing in de-ionized water, washing in running de-ionized water at room temperature, treating with flowing dry oxygen, annealing at an elevated temperature.

3. The method of treating the surfaces of silicon semiconductor devices to provide electrically stable semiconductor surfaces of N-type conductivity comprising washing a body of silicon semiconductor material in one of a class of hydrocarbon solvents including xylene and benzene or alcohol, washing in de-ionized water, washing in nitric acid at approximately 100 degrees centigrade, washing in running de-ionized water at room temperature, treating for about 30 minutes at an elevated temperature with dry oxygen flowing at approximately 40 liters per minute, annealing for approximately 10 minutes at 300 degrees centigrade, removing the oxide in hydrofluoric acid fumes, etching briefly in a solution of nitric and hydrofluoric acid, washing in de-ionized water, washing in running de-ionized water at room temperature, treating the exposed semiconductor surface to HF vapor briefly, treating for approximately 30 minutes at approximately 920 degrees centigrade with dry oxygen flowing at 40 liters per minute, annealing for approximately 10 minutes at about 300 degrees centigrade.

4. The method of treating the surfaces of silicon semiconductor devices to provide electrically stable N-type semiconductor surfaces comprising washing a body of silicon semiconductor material in one of a class of hydrocarbon solvents including xylene and benzene, washing in de-ionized water, washing in hot nitric acid at approximately 100 degrees centigrade, washing in running de-ionized water at room temperature, treating for 30 minutes at approximately 920 degrees centigrade with dry oxygen flowing at approximately 40 liters per minute, annealing for approximately 10 minutes at 300 degrees centigrade, removing the oxide in hydrofluoric acid fumes, etching briefly in a solution of six parts nitric acid to one part hydrofluoric acid by volume, washing in de-ionized water, washing in running de-ionized water at room temperature, diffusing an impurity selected from the group consisting of gold and iron into the exposed semiconductor surface, treating for approximately 30 minutes at approximately 920 degrees centigrade with dry oxygen flowing at 40 liters per minute, annealing for approximately 10 minutes at about 300 degrees centigrade.

5. The method of treating the surfaces of silicon semiconductor devices comprising providing a wafer of single crystal silicon material of one conductivity type, successively diffusing significant impurities into said body to produce an intermediate region in said body of opposite conductivity type and outer regions of said one conductivity type, applying low resistance contacts on opposite faces of said wafer to said outer regions, washing said wafer in one of the class of hydrocarbon solvents including xylene and benzene or alcohol, rinsing in de-ionized water at 100 degrees centigrade, washing in nitric acid at an elevated temperature, rinsing in running de-ionized water for about 30 minutes, treating with dry flowing oxygen at approximately 920 degrees centigrade, annealing for approximately 10 minutes at 300 degrees centigrade, removing the oxide, etching the exposed semiconductor surface briefly, rinsing in de-ionized water at 100 degrees centigrade, washing in nitric acid at an elevated temperature, rinsing in running de-ionized water for about 30 minutes, treating with drying flowing oxygen at approximately 920 degrees centigrade, and annealing for approximately 10 minutes at 300 degrees centigrade.

6. The method of treating the surfaces of silicon semiconductor devices to P-type conductivity surface films comprising washing said body in xylene for about 15 minutes, rinsing said body in de-ionized water, immersing said body in hot nitric acid for about 15 minutes, washing in running de-ionized water at room temperature, treating said body in a stream of substantially pure oxygen at about 920 degrees centigrade, removing the resulting surface film by treating with hydrofluoric acid fumes, etching the exposed semiconductor surface in a solution of six parts nitric acid and one part hydrofluoric acid by volume for 3 seconds, rinsing in de-ionized water, immersing in hot nitric acid for about 15 minutes, washing in running de-ionized water at room temperature, treating in a stream of substantially pure oxygen at about 920 degrees centigrade, and annealing for 10 minutes at about 300 degrees centigrade.

References Cited in the file of this patent

UNITED STATES PATENTS

| | | |
|---|---|---|
| 2,879,190 | Logan et al. | Mar. 24, 1959 |
| 2,899,344 | Atalla et al. | Aug. 11, 1959 |